United States Patent
Brachtendorf

(10) Patent No.: US 6,195,623 B1
(45) Date of Patent: Feb. 27, 2001

(54) TIME-FREQUENCY METHOD AND APPARATUS FOR SIMULATING THE INITIAL TRANSIENT RESPONSE OF QUARTZ OSCILLATORS

(75) Inventor: Hans Georg Brachtendorf, New Providence, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/153,719

(22) Filed: Sep. 15, 1998

(51) Int. Cl.[7] .................................................. G06N 7/00

(52) U.S. Cl. .................................. 703/2; 703/14; 703/19

(58) Field of Search .................................. 703/2, 13, 14, 703/19

(56) References Cited

U.S. PATENT DOCUMENTS

| | | | |
|---|---|---|---|
| 5,588,142 | 12/1996 | Sharrit | 703/14 |
| 6,023,576 | * 2/2000 | Segan | 703/14 |

FOREIGN PATENT DOCUMENTS 0 785 619 A2   1/1997   (EP) .

OTHER PUBLICATIONS

Brachtendorf et al., "A Time–Frequency Algorithm for the Simulation of the Intial Transient Response of Oscillators," Proc. of 1998 IEEE Int'l Symp. on Circuits and Systems (ISCAS), vol. 6, May–Jun. 1998, pp. 236–239.*

Brachtendorf et al., "A Novel Time–Frequency Method for the Simulation of the Steady State of Circuits Driven by Multi–Tome Signals," Proc. of 1997 IEEE Int'l Symp. on Circuits and Systems (ISCAS), vol. 3, Jun. 1997, pp. 1508–1511.*

Brachtendorf et al., "Fast Simulation of the Steady–State of Circuits by the Harmonic Balance Technique," Proc. of 1995 IEEE Int'l Symp. on Circuits and Systems (ISCAS), vol. 2, Apr.–May 1995, pp. 1388–1391.*

Ferris et al., "Simulating Oscillators using SPICE," IEEE Circuits and Devices Magazine, vol. 12, No. 3, May 1996, pp. 28–34.*

Ratier et al., "Quartz Oscillators: Deriving Oscillation Condition by Symbolic Calculus," European Frequency and Time Forum (EFTF) 10th IEE Conf. Publ. 418, Mar. 1996, pp. 442–446.*

(List continued on next page.)

*Primary Examiner*—Kevin J. Teska
*Assistant Examiner*—Kyle J. Choi
(74) *Attorney, Agent, or Firm*—Ryan, Mason & Lewis, LLP

(57) ABSTRACT

A time-frequency method and apparatus are disclosed for simulating the initial transient response of quartz oscillators. An original system of differential algebraic equations that characterize a quartz oscillator are reformulated using a system of well-defined partial differential equations (PDEs). The quartz oscillator is initially represented by a system of ordinary differential algebraic equations that are then reformulated using an artificial system of partial differential algebraic equations. The artificial system represents the behavior of the quartz oscillator with two artificial time axes, $t_1$ and $t_2$, at least one of which has periodic boundary conditions. The artificial system is solved numerically using an integration technique along a strip of the artificial system, defined by $[0, T(t_2)[ \times [0, \infty[$. Thereafter, the time behavior of the signal is calculated from the numerical solution of the artificial system. The artificial system of partial differential algebraic equations is solved using a Fourier expansion in the direction of the time axis having periodic boundary conditions. The samples for the Fourier expansion are selected within the strip which are uniquely related to the coefficients of the Fourier expansion. A discrete Fourier transform technique may be utilized to efficiently relate the samples and the Fourier coefficients.

15 Claims, 2 Drawing Sheets

Zheng, Q. "The Transient Behavior of an Oscillator," International Series of Numerical Mathematics, vol. 117, 1994, pp. 143–154.*

Denk, G. "A New Efficient Numerical Integration Scheme for Highly Oscillatory Electric Circuits," International Series of Numerical Mathematics, vol. 117, 1994, pp. 1–15.*

* cited by examiner

TIME-FREQUENCY METHOD AND APPARATUS FOR SIMULATING THE INITIAL TRANSIENT RESPONSE OF QUARTZ OSCILLATORS

FIELD OF THE INVENTION

The present invention relates to electronic circuit simulators, and more particularly, to methods and apparatus for calculating the initial transient response of quartz oscillator circuits.

BACKGROUND OF THE INVENTION

Oscillators are ubiquitous in physical systems, especially electronic and optical systems, where oscillators are utilized in phase locked loops, voltage controlled oscillators, microprocessors and transceivers. For example, in radio frequency (RF) communication systems, oscillators are used for frequency translation of information signals and for channel selection. Oscillators are also present in digital electronic systems that require a time reference or clock signal to synchronize operations.

The design, testing and fabrication of oscillator circuits are often an expensive and time-consuming process. The complexity and fabrication costs associated with current oscillators have led to the development of a number of products for simulating such oscillators. Such simulators allow the characteristics and operation of the oscillator to be evaluated before the prototypes of the oscillator are even manufactured. Several types of computer aided design (CAD) tools have been developed or proposed to facilitate the design and fabrication of oscillator circuits.

One characteristic of interest for any oscillator is the initial transient response of the oscillator, shown in FIG. 1, typically characterized by the time constant, T-c, until the oscillator circuit reaches steady state. Considerable effort has been expended over the years in understanding the transient response of oscillators and in developing analytical, computational and experimental techniques for its characterization. For a brief review of such analytical, computational and experimental techniques, see, for example, G. Denk, "A New Efficient Numerical Integration Scheme For Highly Oscillatory Electric Circuits," Int. Series of Numerical x Math., Vol. 117, 1–15, (1994); Q. Zheng, "The Transient Behavior of an Oscillator," Int. Series of Numerical Math., Vol. 117, 143–164 (1994); R. E. Mickens, "Oscillations In Planar Dynamic Systems," (World Scientific, 1996), each incorporated by reference herein.

The simulation of oscillator circuits exhibiting steady-state behavior, i.e., operating under DC conditions, is relatively straightforward because only the algebraic portion of the differential equations has to be solved. Under steady-state conditions, the oscillator circuit may be simulated by a system of non-linear equations that may be solved using an iterative approach. The number of non-linear equations is at least equal to the number of nodes in the oscillator circuit. For periodic steady state, the system's differential algebraic equations also have to be solved.

The simulation of oscillator circuits exhibiting transient behavior, i.e., prior to reaching steady state, however, is substantially more complex. While the number of non-linear equations describing the oscillator circuit is still at least equal to the number of nodes in the oscillator circuit, equations corresponding to inductive or capacitive devices will be differential equations. Thus, under transient conditions, the oscillator circuit must be simulated using a system of non-linear differential equations. Conventional simulation techniques solve the system of non-linear differential equations using an iterative or empirical approach. The solution is even more complicated when a system is free running, or autonomous, and does not have an outside force driving the frequency. Thus, the frequency, and consequently, the period, are not known a priori.

The system of non-linear differential equations must be solved at each time point. Furthermore, the time-step is fixed by the highest frequency of interest, $\tau_{eN}$, whereas the time interval for which a transient solution has to be calculated is fixed by the smallest time constant, $\tau_C$, of the system. Traditional integration formulas use expansions in the form of Taylor series or polynomial approximations. Because these approximations are not well suited for oscillatory solutions, the time-step must be much smaller than the period of oscillation. Examples for which the settling time of a circuit is tens of times larger than the period of the asymptotic steady state solution include high Q-filters, oscillators and phase-locked loops (PLLs).

FIG. 1 shows the initial transient response of a representative oscillator. The oscillation frequency of this oscillator is much higher than the time constant, $\tau_c$, of the envelope, leading to extraordinarily long run-times for its simulation. Such run-times always result for quasi-sinusoidal oscillators, such as quartz oscillators. This is because the lower the distortion, the longer the settling time. Hence, traditional time-domain simulation methods are prohibitive.

In free running systems, the input signal is non-periodic, and thus the system of non-linear differential equations can only be solved by a time-domain analysis. As previously indicated, in systems having long settling times, such as quartz oscillators, the number of time points required to simulate the envelope using time-domain analysis becomes prohibitively large. The well known "envelope following" technique has been developed to overcome this problem. The envelope following technique approximates the oscillation by a series of Fourier coefficients. As shown in FIG. 2, the envelope following technique decouples the waveform and provides one solution for the high frequency oscillation and another solution for the envelope.

In other words, the envelope following technique iteratively solves for the complete waveform over one clock period, using time integration techniques, then skips a number of clock cycles ($\Delta t^*$), before solving another waveform over one clock period. Doing so reduces the number of time points to be solved. For each clock period, $(2k+1)$ samples of the waveform are obtained in time steps, $\Delta t$, where k is the number of the highest harmonic of interest. The number of clock cycles that can be skipped depends on how quickly the envelope is changing. The $(2k+1)$ Fourier coefficients, $X_k(t)$, that characterize the waveform are each obtained from a vector of $(2k+1)$ samples $\{x_k(t_0), x_k(t_0+\Delta t), \ldots x_k(t_0+n\Delta t), \ldots x_k(t_0+2k\Delta t)\}$. Since there is only one measurement at time $(t_0)$ to calculate the $(2k+1)$ Fourier coefficients, $X_k(t)$, some averaging or assumption must be utilized, which results in incorrect Fourier coefficients. For example, one possible assumption used by conventional techniques is that the Fourier coefficients, $X_k(t_0)$ equals $X_k(t_0+\tau)$, for all $\tau$ between zero and the time at the end of the period, T. In other words, such techniques assume that the Fourier coefficients are the same over a clock period, which results in an inaccurate characterization of the initial transient response or settling time, $\tau_c$. Since only one measurement in time $(t_0)$ is used to calculate the $(2k+1)$ Fourier coefficients, $X_k(t)$, the Fourier system is not uniquely defined.

SUMMARY OF THE INVENTION

Generally, a method and apparatus are disclosed for simulating the initial transient response of quartz oscillators using a time-frequency method. According to one aspect of the invention, an original system of differential algebraic equations that characterize a quartz oscillator are reformulated using a system of well-defined partial differential equations (PDEs). More specifically, the quartz oscillator is initially represented by a system of ordinary differential algebraic equations, such as those in the prior art. These ordinary differential algebraic equations are then reformulated using an artificial system of partial differential algebraic equations. The artificial system represents the behavior of the quartz oscillator with two artificial time axes, $t_1$ and $t_2$. At least one of the time axes, $t$, and $t_2$, has periodic boundary conditions.

According to an aspect of the invention, the artificial system is solved numerically using an integration technique along a strip of the artificial system, defined by $[0, T(t_2)[ \times [0, \infty[$. Finally, the time behavior of the signal is calculated from the numerical solution of the artificial system.

According to another aspect of the invention, the artificial system of partial differential algebraic equations is solved using a Fourier expansion in the direction of the time axis having periodic boundary conditions. The samples for the Fourier expansion are selected within the strip which are uniquely related to the coefficients of the Fourier expansion. In addition, a discrete Fourier transform technique may be utilized to efficiently relate the samples and the Fourier coefficients.

DETAILED DESCRIPTION

Figure 1:
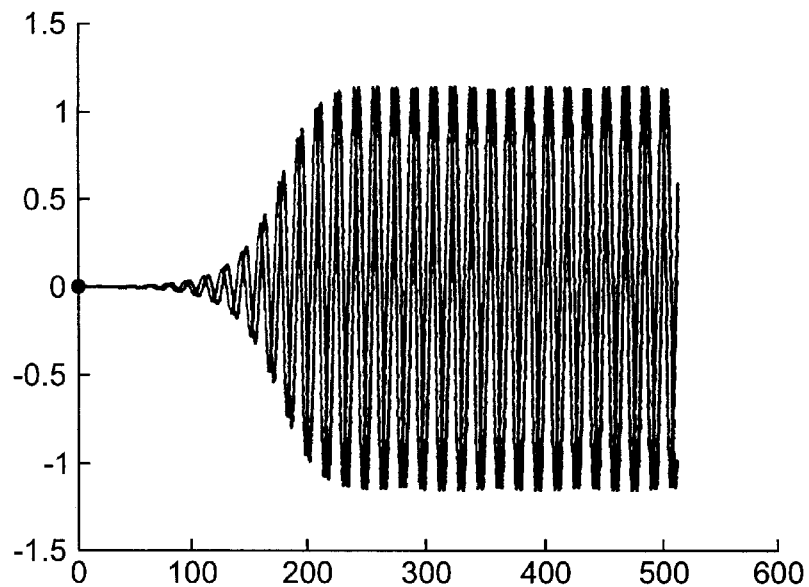
FIG. 1 illustrates the initial transient response of a representative oscillator.
Figure 2:
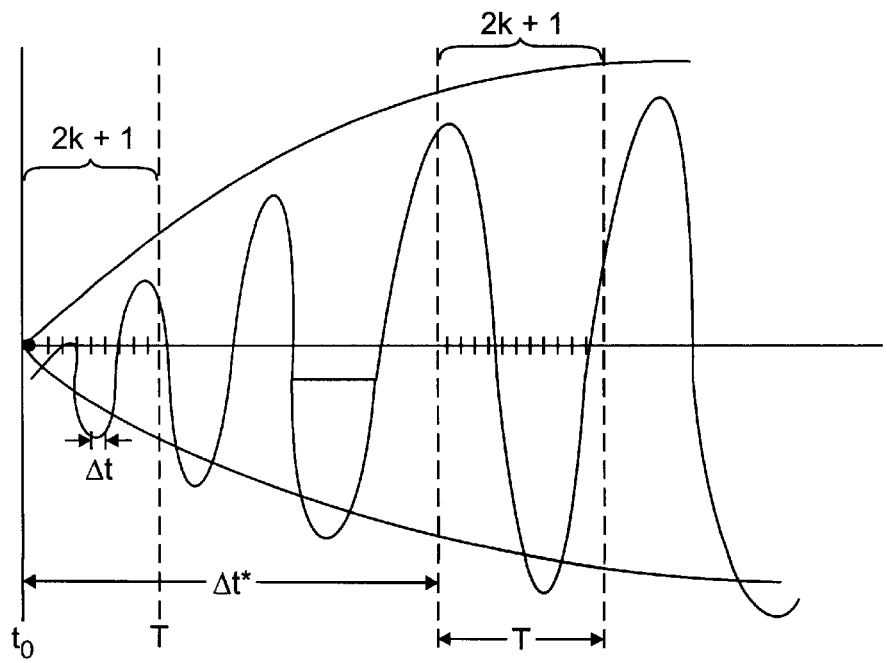
FIG. 2 illustrates the envelope following technique having one solution for the high frequency oscillation and another solution for the envelope.

The present invention simulates the initial transient response of oscillators using a time-frequency method. The disclosed method reformulates the original system of non-linear differential equations that characterize an oscillator by a system of well-defined partial differential equations (PDEs). The original system of non-linear differential equations of dimension N are given by:

$$f(v(t), \dot{v}(t), t) := i(v(t)) + \frac{d}{dt} q(v(t)) + i_s(t) = 0 \qquad \text{Eq. (1)}$$

where v: $R \to R^N$ is the vector of node voltages and some branch currents. q: $R^N \to R^N$ is the vector of charges and fluxes and i: $R^N \to R^N$ is the vector of sums of current entering each node and branch voltages, both depending on $v(t)$. $i(v)$ and $q(v)$ are assumed to be differentiable functions and equation 1 has a unique solution for any initial condition. Furthermore, $i_s$: $R \to R^N$ is the vector of input sources, both voltages and currents. The vector of unknowns $v(t)$ is referred to herein as the vector of node voltages. Since the circuit may be autonomous (free running), the stimulus vector is constant in time:

$$i_s(t) = \text{const.} \qquad \text{Eq. 2}$$

Definition of Artificial System

In accordance with the present invention, instead of solving the set of ordinary non-linear differential equations that exhibit the multi-rate behavior, the partial differential equation (PDE) is solved for:

$$f(D_1 v(t_1,t_2), D_2 v(t_1,t_2), v(t_1,t_2), t_1, t_2) := i(v(t_1,t_2)) + D_1 q(v(t_1,t_2)) + D_2 q(v(t_1,t_2)) + i_s = 0 \qquad \text{Eq. (3)}$$

with identical stimulus $i_s$ of the original ordinary non-linear differential equations and identical current-voltage and charge-voltage relations. $v(t_1, t_2)$ is assumed being periodic in $t_1$ with unknown period $T(t_2)$. The definitions of $D_1$ and $D_2$ are given below. It can be shown that Equation (3) has only a unique solution if and only if Equation (1) has a unique solution.

The quasi-periodic waveform $x(t_1, t_2)$ of Equation (3) are expanded for a fixed $t_2$ by a Fourier polynomial:

$$x(t_1, t_2) = \sum_{k=-\infty}^{\infty} X(k, t_2) e^{jk\omega(t_2)t_1} \qquad \text{Eq. (4)}$$

with unknown fundamental angular frequency $\omega(t_2)$ which depends in general on $t_2$. The operators $D_1$ and $D_2$ applied to $x(t_1, t_2)$ are defined as follows:

$$D_1 x(t_1, t_2) := \sum_{k=-\infty}^{\infty} jk\omega(t_2) X(k, t_2) e^{jk\omega(t_2)t_1} \qquad \text{Eq. (5)}$$

$$D_2 x(t_1, t_2) := \sum_{k=-\infty}^{\infty} \frac{d X(k, t_2)}{d t_2} e^{jk\omega(t_2)t_1} + \sum_{k=-\infty}^{\infty} jk \frac{d\omega(t_2)}{d t_2} t_2 X(k, t_2) e^{jk\omega(t_2)t_1}$$

Please note the non-standard formulation of the secular term $jk\{\delta\omega(t_2)/dt_2\}t_2$. The waveforms corresponding to Equations (4) and (5) are by definition periodic in $t_1$ with an a priori unknown time-varying frequency. Hence, the solution must not be calculated in the complete $(t_1, t_2)$ plane but rather along a strip 310 $[0, T(t_2)[ \times [0, \infty[$ which makes the algorithm presented efficient. Because the time constant of the envelope is typically much smaller than the oscillation, time-steps along the $t_2$ axis are possible which are magnitudes larger than the period. Also note that the Fourier coefficients of the negative frequencies are complex conjugate to the corresponding positive ones.

Figure 3:
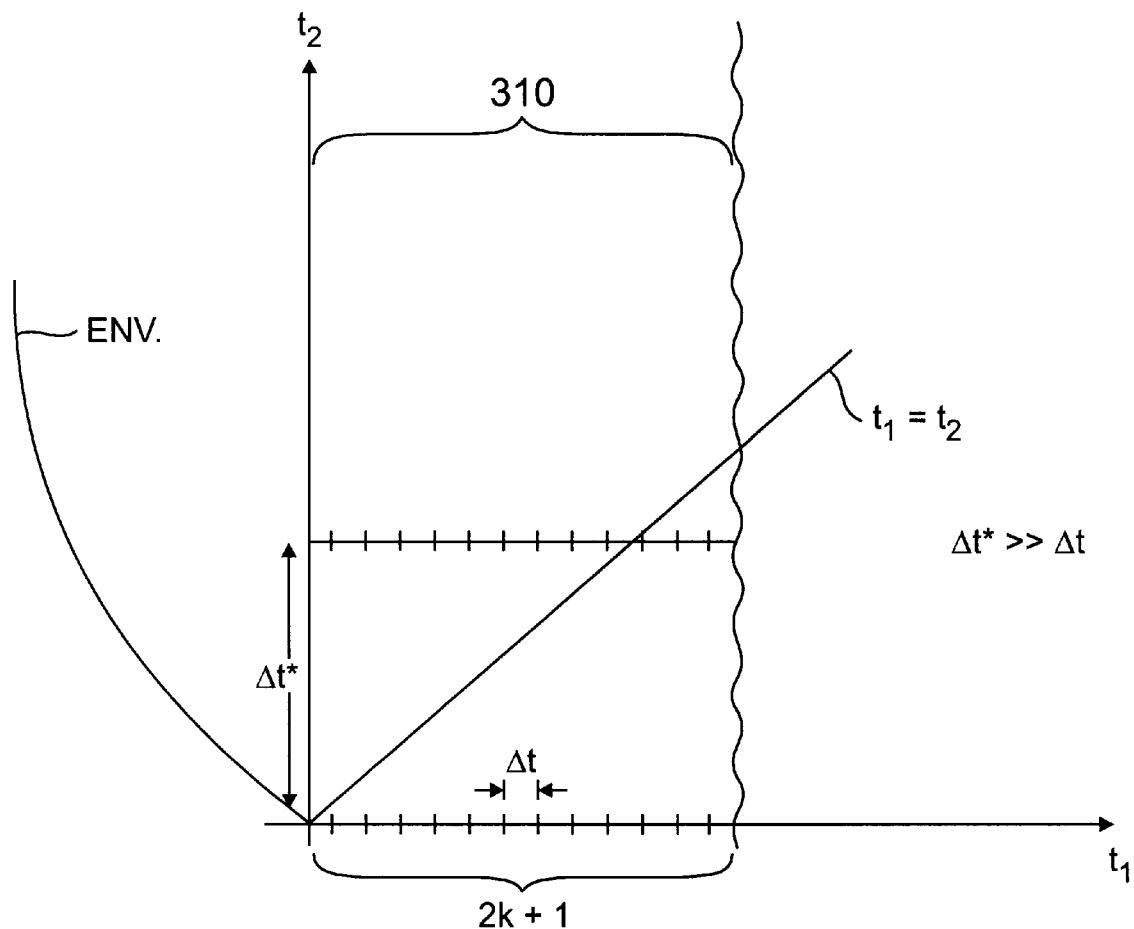
FIG. 3 illustrates a domain for which an artificial system in accordance with the present invention is solved to characterize the initial transient response of a representative oscillator.

FIG. 3 illustrates an artificial system used in accordance with the present invention to solve the system of non-linear differential equations that characterize an oscillator, discussed above. The artificial system shown in FIG. 3 allows the vector of (2k+1) samples $\{x_k(t_0), x_k(t_0+\Delta t), \ldots x_k(t_0+n\Delta t), \ldots x_k(t_0+2k\Delta t)\}$, to be uniquely related to the (2k+1) Fourier coefficients, $X_k(t)$, that characterize the waveform, by constraining $t_1=t_2=t$. The relationship $t_1=t_2=t$ provides the artificial time of the artificial system. As discussed below, the partial differential equations (PDEs) are only solved along the strip 310, and continue along $t_1$ periodically. In other words, the periodic coefficients are calculated along the $t_1$ axis, for constant $t_2$. (2k+1) samples, $x_k$, are used to derive the (2k+1) Fourier coefficients, $X_k$. Specifically, as shown in FIG. 3, each of the (2k+1) vector Fourier coefficients are obtained from (2k+1) samples at time, $t_0$, corresponding to the oscillation, and a further (2k+1) vector Fourier coefficients are obtained from (2k+1) samples at time, $t_0+\Delta t^*$. Therefore, the artificial system shown in FIG. 3 is uniquely defined. It is noted that the original system is obtained from the artificial system of FIG. 3 by solving for $t_1=t_2=t$.

Numerical Solution of Artificial System

For a numerical treatment we have to approximate the solution of Equation (4) by a subspace which is spanned by a finite number of Fourier polynomials:

$$x(t_1, t_2) = \sum_{k=-K}^{K} X(k, t_2) e^{jk\omega(t_2)t_1} \qquad \text{Eq. (6)}$$

The nonlinear device constitutive equations are evaluated for fixed $t_2$ by a collocation method on a predefined grid, e.g., the time-frequency approach specified by Equation (6) is back-transformed into the time domain by employing the inverse Discrete Fourier Transform (IDFT). Then the device equations are evaluated for distinct time-points on the mesh and finally back-transformed into the time-frequency domain by the DFT. This is common practice for the well-known harmonic balance technique and is therefore not considered here in detail.

Using the fact that the partial derivative with regard to $t_1$ for the Fourier polynomial in Equation (6) is simply the multiplication with $k\omega$ for the k-th harmonic, results into the system of ordinary differential equations in $t_2$:

$$F(V(t_2), t_2) = I(V(t_2)) + j\Omega Q(V(t_2)) + \qquad \text{Eq. (7)}$$
$$jt_2 \frac{d}{dt_2}\Omega Q(V(t_2)) + \frac{d}{dt_2} Q(V(t_2)) + I_s$$
$$= 0$$

where $\left(j = \sqrt{-1} \text{ and } \omega(t) = 2\pi/T(t)\right)$.

$$\Omega := \{\Omega_{nm}\} \qquad \text{Eq. (8)}$$
$$\Omega_{nm} := \begin{cases} \Omega_{nm} & \text{if } n = m \\ 0 & \text{if } n \neq m \end{cases}$$
$$\Omega_{nm} := \text{diag}\{-K\omega, \ldots, -\omega, 0, \omega, \ldots, K\omega\}$$

Note that the fundamental frequency $\omega$ is unknown a priori. Equation (7) is solved in $t_2$ direction for initial conditions $V(t_0) = V_0$ and $\omega_0 = \omega)(0)$ using any integration formula, such as those described in C. W. Gear, "Numerical Initial Value Problems In Ordinary Differential Equations," (Prentice Hall, 1971), incorporated by reference herein. Because the oscillation is approximated by a Fourier polynomial, Equation (7) does not exhibit any multirate behavior (assuming that there is only one significant oscillation). Furthermore, because e, is an unknown, there is exactly one additional unknown than equations in Equation (8). For getting an isolated solution of the oscillator waveforms, it is common practice to set the imaginary part of a fundamental frequency of one node voltage equal to zero.

It is to be understood that the embodiments and variations shown and described herein are merely illustrative of the principles of this invention and that various modifications may be implemented by those skilled in the art without departing from the scope and spirit of the invention.

I claim:

1. A computer-implemented method for characterizing the initial transient response of a signal produced by an autonomous quartz oscillator, said computer-implemented method comprising the steps of:
   representing said quartz oscillator with a system of differential algebraic equations;
   reformulating said system of ordinary differential algebraic equations by an artificial system of partial differential algebraic equations, said artificial system representing the behavior of said quartz oscillator with two artificial time axes, at least one of said time axes having periodic boundary conditions; and
   calculating the time behavior of said signal of said differential algebraic equations from a numerical solution along a strip of said artificial system, wherein said signal has an unknown fundamental frequency.

2. The method according to claim 1, further comprising the steps of solving said artificial system of partial differential algebraic equations using a Fourier expansion in the direction of said at least one of said time axes having periodic boundary conditions, wherein samples for said Fourier expansion are selected within said strip which are uniquely related to the coefficients of the Fourier expansion.

3. The method according to claim 1, wherein discrete Fourier transform techniques are utilized to efficiently relate said samples and said Fourier coefficients.

4. The method according to claim 1, wherein said system of ordinary differential algebraic equations are given by:

$$f(v(t), \dot{v}(t), t) := i(v(t)) + \frac{d}{dt}q(v(t)) + i_s(t) = 0 \qquad \text{Eq. (1)}$$

5. The method according to claim 1, wherein said strip is defined by $[0, T(t_2)[\times[0, \infty[$.

6. The method according to claim 1, wherein said artificial system is defined by the following equations:

$$f(D_1v(t_1, t_2), D_2v(t_1, t_2), v(t_1, t_2), t_1, t_2) := \qquad \text{Eq. (3)}$$
$$i(v(t_1, t_2)) + D_1q(v(t_1, t_2)) + D_2q(v(t_1, t_2)) + i_s = 0$$

$$x(t_1, t_2) = \sum_{k=-\infty}^{\infty} X(k, t_2) e^{jk\omega(t_2)t_1} \qquad \text{Eq. (4)}$$

$$D_1x(t_1, t_2) := \sum_{k=-\infty}^{\infty} jk\omega(t_2) X(k, t_2) e^{jk\omega(t_2)t_1} \qquad \text{Eq. (5)}$$

$$D_2x(t_1, t_2) := \sum_{k=-\infty}^{\infty} \frac{dX(k, t_2)}{dt_2} e^{jk\omega(t_2)t_1} +$$
$$\sum_{k=-\infty}^{\infty} jk\frac{d\omega(t_2)}{dt_2} t_2 X(k, t_2) e^{jk\omega(t_2)t_1}.$$

7. The method according to claim 1, wherein said numerically solution is defined by the following equations:

$$x(t_1, t_2) = \sum_{k=-K}^{K} X(k, t_2) e^{jk\omega(t_2)t_1} \qquad \text{Eq. (6)}$$

$$F(V(t_2), t_2) = I(V(t_2)) + j\Omega Q(V(t_2)) + \qquad \text{Eq. (7)}$$
$$jt_2 \frac{d}{dt_2}\Omega Q(V(t_2)) + \frac{d}{dt_2} Q(V(t_2)) + I_s$$
$$= 0$$

$$\Omega := \{\Omega_{nm}\} \qquad \text{Eq. (8)}$$
$$\Omega_{nm} := \begin{cases} \Omega_{nm} & \text{if } n = m \\ 0 & \text{if } n \neq m \end{cases}$$
$$\Omega_{nm} := \text{diag}\{-K\omega, \ldots, -\omega, 0, \omega, \ldots, K\omega\}$$

where $(j=\sqrt{-1}$ and $f(t)=2\Pi/T(t))$.

8. A system for characterizing the initial transient response of a signal produced by an autonomous quartz oscillator, said system comprising:
   a memory for storing computer readable code; and
   a processor operatively coupled to said memory, said processor configured to represent said quartz oscillator with a system of differential algebraic equations, reformulate said system of ordinary differential algebraic equations by an artificial system of partial differential algebraic equations, said artificial system representing the behavior of said quartz oscillator with two artificial time axes, at least one of said time axes having periodic boundary conditions, and calculate the time behavior of said signal of said differential algebraic equations from a numerical solution along a strip of said artificial system, wherein said signal has an unknown fundamental frequency.

9. The method according to claim 8 wherein said numerical solution of said artificial system uses an integration technique along said strip of said artificial system.

10. The method according to claim 8, further comprising the steps of solving said artificial system of partial differential algebraic equations using a Fourier expansion in the direction of said at least one of said time axes having periodic boundary conditions, wherein samples for said Fourier expansion are selected within said strip which are uniquely related to the coefficients of the Fourier expansion.

11. The method according to claim 8, wherein discrete Fourier transform techniques are utilized to efficiently relate said samples and said Fourier coefficients.

12. A computer-implemented method for characterizing the initial transient response of a signal produced by an autonomous quartz oscillator, said computer-implemented method comprising the steps of:

generating a reformulated artificial system of partial differential algebraic equations from a system of ordinary differential algebraic equations that represent said quartz oscillator, said artificial system representing the behavior of said quartz oscillator with two artificial time axes, at least one of said time axes having periodic boundary conditions; and determining the time behavior of said signal of said differential algebraic equations from a numerical solution of said artificial system, wherein said signal has an unknown fundamental frequency.

13. The method according to claim 12 wherein said numerical solution of said artificial system uses an integration technique along a strip of said artificial system.

14. The method according to claim 12, further comprising the steps of solving said artificial system of partial differential algebraic equations using a Fourier expansion in the direction of said at least one of said time axes having periodic boundary conditions, wherein samples for said Fourier expansion are selected within said strip which are uniquely related to the coefficients of the Fourier expansion.

15. The method according to claim 12, wherein discrete Fourier transform techniques are utilized to efficiently relate said samples and said Fourier coefficients.

* * * * *